United States Patent
Yu et al.

(10) Patent No.: US 7,580,129 B2
(45) Date of Patent: Aug. 25, 2009

(54) METHOD AND SYSTEM FOR IMPROVING ACCURACY OF CRITICAL DIMENSION METROLOGY

(75) Inventors: Shinn-Sheng Yu, Hsin-Chu (TW);
Jacky Huang, Chu-Bei (TW);
Chih-Ming Ke, Hsin-Chu (TW);
Tsai-Sheng Gau, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 359 days.

(21) Appl. No.: 11/678,413

(22) Filed: Feb. 23, 2007

(65) Prior Publication Data

US 2008/0204730 A1    Aug. 28, 2008

(51) Int. Cl.
*G01B 11/00* (2006.01)
(52) U.S. Cl. .................................................. 356/394
(58) Field of Classification Search ......... 356/128–137, 356/388, 394
See application file for complete search history.

(56) References Cited

U.S. PATENT DOCUMENTS

| | | | | |
|---|---|---|---|---|
| 5,905,573 | A * | 5/1999 | Stallard et al. | 356/519 |
| 6,869,739 | B1 * | 3/2005 | Ausschnitt et al. | 430/30 |
| 7,042,551 | B2 * | 5/2006 | Ausschnitt | 355/55 |

* cited by examiner

*Primary Examiner*—Michael P Stafira
(74) *Attorney, Agent, or Firm*—Haynes and Boone, LLP

(57) ABSTRACT

A method for improving accuracy of optical critical dimension measurement of a substrate is provided. A process parameter that influences the refractive index and extinction coefficient of a thin film in the substrate is identified. A refractive index and extinction coefficient across a plurality of wavelengths as a function of the process parameter is identified. During the regression modeling of the optical critical dimension measurement, the refractive index and extinction coefficient across the plurality of wavelengths is adjusted through the function via the process parameter.

20 Claims, 9 Drawing Sheets

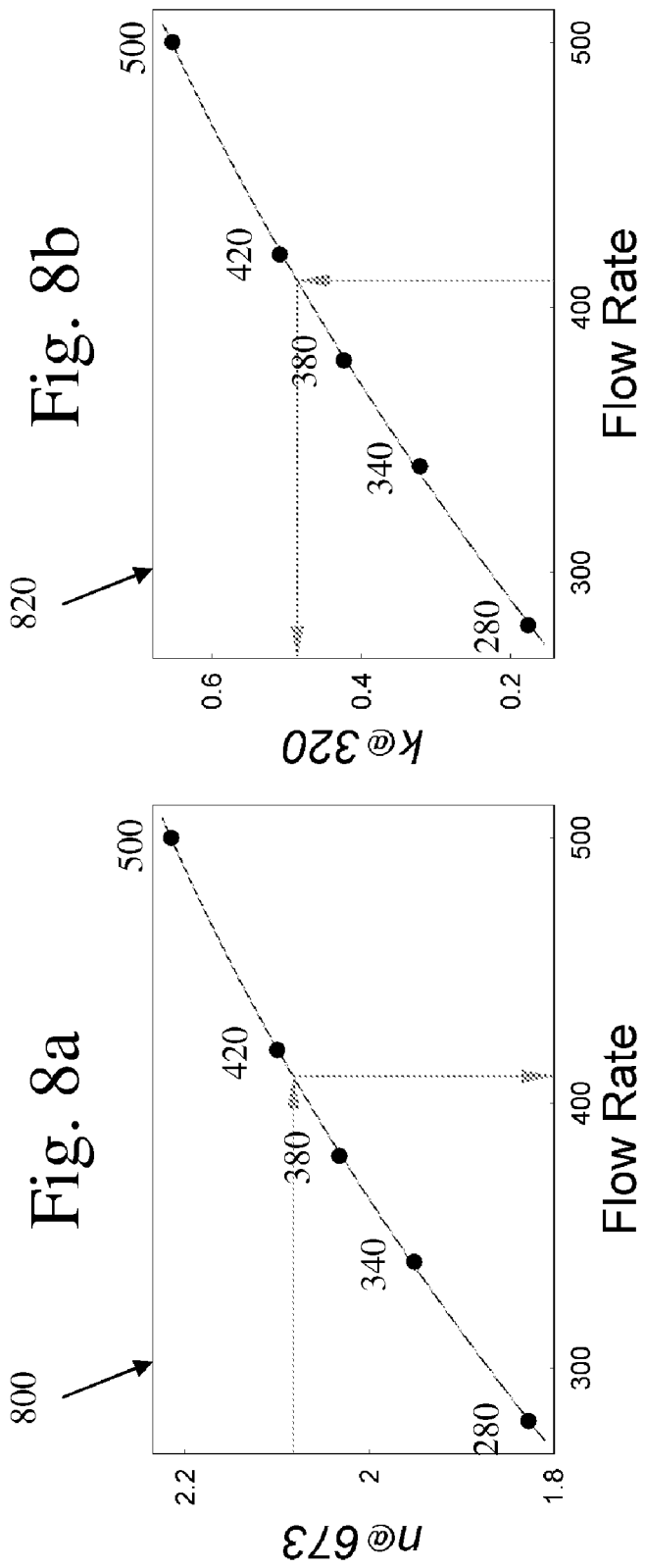

METHOD AND SYSTEM FOR IMPROVING ACCURACY OF CRITICAL DIMENSION METROLOGY

BACKGROUND

The present disclosure relates in general to semiconductor manufacturing technology, and more particularly, to a system and method for improving accuracy of critical dimension metrology in a semiconductor wafer processing. The present disclosure also relates to a method and system for improving accuracy of critical dimension metrology through providing an adjustable refractive index/extinction coefficient (n/k) of thin films in the substrate during regression modeling of scatterometry-based optical critical dimension (OCD) metrology.

In integrated circuit manufacturing technology, a resist layer is typically applied to a semiconductor wafer surface, followed by an exposure of the resist through a mask (e.g., a reticle or photomask). A post-exposure bake is then performed to initiate the deprotection reaction (for the positive-tone resist), which makes the chemically amplified resist in the exposed area more soluble in the developer and thus will be developed away in the subsequent development process. An after-development inspection (ADI) is then performed to inspect the critical dimension (CD) and profile of the exposed resist using a scanning electron microscope (SEM) to determine whether it conforms to a specification. If the resist is within specification, a pattern is etched or transferred and the resist is stripped. An after-etching inspection (AEI) is then performed on the wafer.

Traditional SEM inspection, however, becomes a bottleneck for providing accurate and repeatable CD due to the ArF resist being easily damaged by the e-beam and the inherent line edge roughness of the resist pattern. In response, a scatterometry-based optical critical dimension (OCD) metrology is often used instead of SEM inspection. OCD employs light mainly in the visible range for CD measurement, thus has little impact to the measured resist pattern. In addition, since only patterns of large gratings (about 50 μm squared) are measured and only light scattered to a specific angle is collected, OCD is impervious to line edge roughness. Further, OCD can detect not only the CD but profile (manifested as side-wall angle (SWA)) of the resist pattern as well as thickness of each thin film in the wafer substrate. Thus, OCD provides more consistent and comprehensive CD information than SEM.

Both SEM and OCD may be used in after-development inspection and after-etching inspection to optimize CD uniformity. With existing SEM or OCD tools, inter-field CD uniformity may be optimized. Inter-field CD uniformity optimization may be obtained by examining the field-to-field CD difference between a plurality of fields on a wafer. For example, inter-field CD uniformity optimization may be performed over 80 fields to improve the quality of selected measurement points of a wafer surface area. In addition, intra-field CD uniformity optimization may be performed with existing SEM or OCD tools by examining CD differences within a field of the wafer.

However, unlike SEM tools, OCD tools obtain CD measurements indirectly and entirely based on the resist profile reconstructed through simulation. Thus, the accuracy of CD and side-wide angle (SWA) measurements rely entirely on the accuracy of the simulation. In order to reduce computation load, many OCD tools simulate the resist profile by assuming a fixed refractive index/extinction coefficient (n/k) of each thin film in the substrate. For example, the refractive index/extinction coefficient (n/k) of a thin film in the substrate, such as organic bottom anti-reflection coating (BARC), is fixed during regression modeling of the OCD metrology.

Other types of thin films, such as inorganic BARC, may have varying refractive indices/extinction coefficients (n/k) due to a difference in control of the thin film deposition process. Thus, the assumption of fixed refractive indices/extinction coefficients (n/k) may cause OCD errors for these types of thin films. Therefore, a need exists for a method and system that improve accuracy of OCD metrology by varying the refractive indices/extinction coefficients (n/k), such that OCD errors due to fixed refractive indices/extinction coefficients (n/k) may be minimized.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 8a is a diagram illustrating exemplary how the flow rate of a specific gas is determined based on the n measured at a within-wafer location using equation (2).

FIG. 8b is a diagram illustrating exemplary how the corresponding k is determined based on the determined flow rate of the specific gas using equation (3).

DETAILED DESCRIPTION

Figure 1:
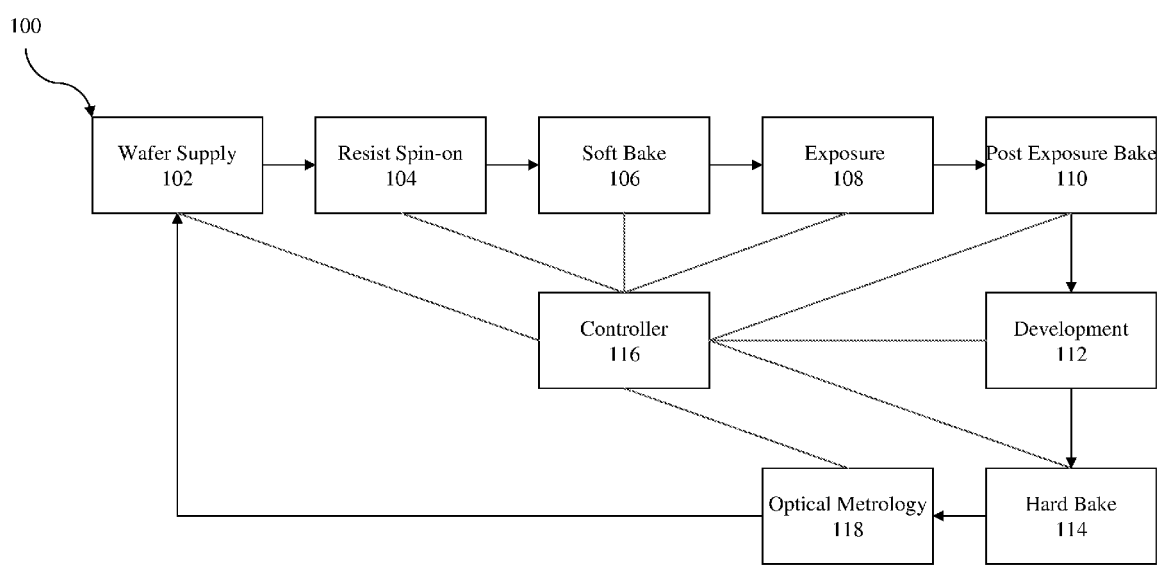
FIG. 1 is a diagram of an exemplary lithography-cell.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, an exemplary lithography-cell 100 includes wafer supply racks 102, a resist spin-on station 104, a soft bake station 106, an exposure station 108, a post exposure bake station 110, a development station 112, a hard bake station 114, and an optical metrology station 118. A controller 116 automates the lithography-cell 100 by communication with all above units.

Process wafers are first supplied by wafer supply racks 102 to the resist spin-on station 104 to coat the resist on a wafer surface. The wafer is then soft-baked at the soft-bake station 106 and transferred to the exposure station 108 to expose the wafer. Afterwards, a post-exposure bake is performed on the wafer at the post-exposure baking station 110 and the wafer is transferred to the development station 112. After development, the wafer is hard-baked at the hard-baked station 114 and then transferred to the optical metrology station 118. The optical metrology station 118 includes a spectrometer for collecting spectra of scattered light from the resist in a digital format. The controller 116 processes the collected spectra of scattered light and performs a diffraction analysis.

Figure 2:
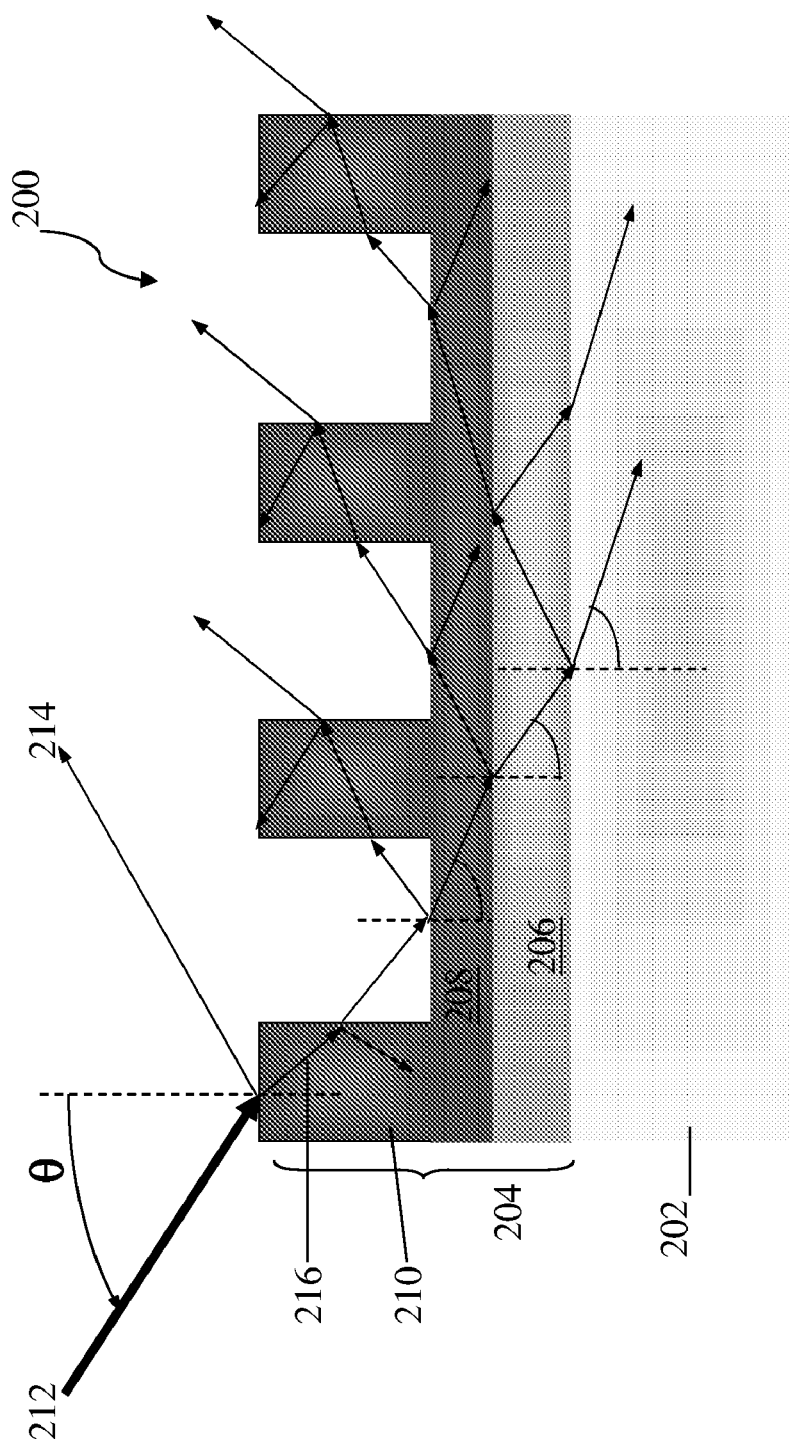
FIG. 2 is a diagram illustrating an exemplary process wafer subjected to scatterometry-based optical critical dimension (OCD) measurement.

Referring to FIG. 2, a diagram illustrating an exemplary process wafer 200 subjected to scatterometry-based optical critical dimension (OCD) measurement is depicted. Wafer 200 includes a first layer 202 and a second layer 204. The first layer 202 may comprise a substrate made of silicon or polysilicon. The first layer is also referred to as an OD layer. The second layer 204 may comprise a Poly layer 206, an anti-reflection layer 208, and/or a patterned resist layer 210. The Poly layer 206 may include silicon dioxide. The patterned resist layer 210 may include material such as $Si_3N_4$. The anti-reflection layer 208 may be an organic bottom anti-reflection coating (BARC) or an inorganic BARC, such as silicon oxynitride (SiON).

Incident light 212 from a probing light source of a spectrometer may be directed to a probe area of the resist layer 210 forming an incident angle θ of between 0 to 90 degrees with respect to the resist surface. A portion of the incident light 212 is scattered from the surface of resist layer 210 after passing through resist portion 216 to produce detectable scattered light 214. Scattered light 214 is collected by a conventional detector, such as a diode array detector, at different wavelengths. A diffraction analysis is then performed on scattered light 214 to obtain three dimensional information and other additional information of the resist layer 210. The diffraction analysis may be performed by a controller, such as controller 116 in FIG. 1.

During the diffraction analysis, a simulation of the resist profile is performed by regression to obtain the measured CD data. During the regression modeling of OCD, only the resist top CD, the resist bottom CD, the thickness of the resist, and the thickness of each thin film in the wafer substrate are treated as free parameters. The refractive index (n)/extinction coefficient (k) of each thin film in the wafer substrate, however, are assumed fixed to relieve the computational loading of the regression. This is the case for such thin film as the organic BARC. However, for the inorganic BARC of which the n/k is tunable, the stability of the n/k depends on the control of the thin film deposition process, which can never be made perfect.

To ensure the quality of the obtained CD data, a goodness of fit (GOF) is used to quantify the simulation quality. The GOF is defined in equation (1):

$$GOF = \exp\left\{-\frac{\sum_\lambda [P_M(\lambda) - P_S(\lambda)]^2}{\sum_\lambda [P_M(\lambda) - A_M]^2}\right\}, \quad (1)$$

where $P_M(\lambda)/P_S(\lambda)$ is the measured/simulated scattered signal at wavelength λ, and $$A_M = \frac{1}{\# \text{ of } \lambda's}\sum_\lambda P_M(\lambda).$$

Thus, GOF is a measure of deviation between the measured spectrum and its theoretical prediction.

Exemplary CD measurements for a wafer comprising a thin film, such as inorganic BARC of tunable n/k, is performed. The results indicate that the GOF's near the wafer center are lower than those at other areas of the wafer. This means that the obtained CD data near the wafer center may not be as accurate as those at other areas of the wafer. This inaccuracy of the obtained CD data is thought of as resulting from the assumption that the n/k of each thin film in the wafer substrate are fixed during the regression modeling of OCD.

Figure 3A:
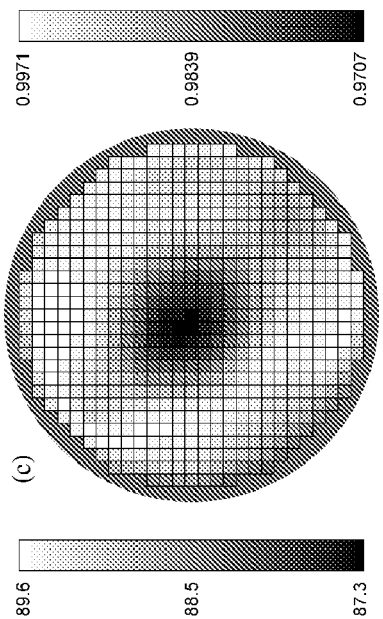
FIG. 3a is a within-wafer CD map measured by the OCD tool after exposure of a specific mask feature.
Figure 3B:
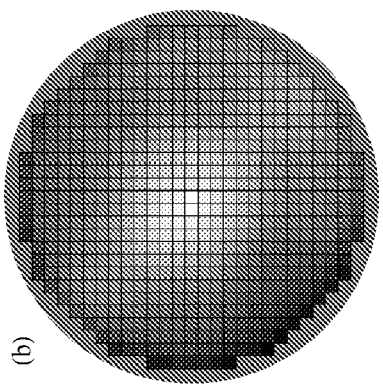
FIG. 3b is a within-wafer SWA map measured by the OCD tool after exposure of a specific mask feature.
Figure 3C:
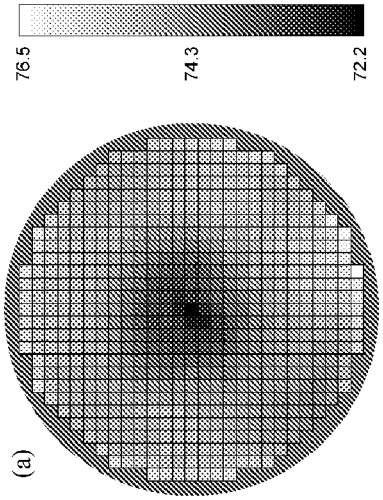
FIG. 3c is the GOF map corresponding to FIG. 3a and FIG. 3b.
Figure 3D:
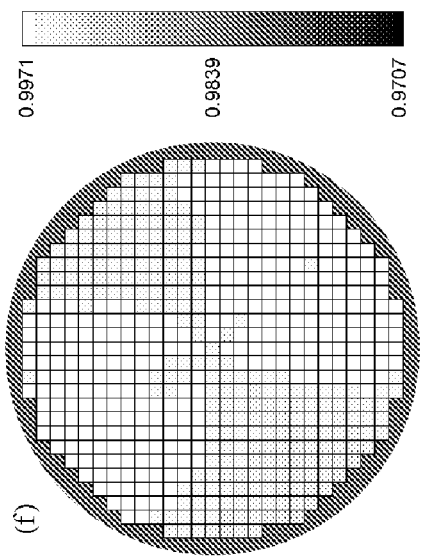
FIG. 3d is a within-wafer CD map measured by OCD tool with the OCD regression modeling done by using the measured n/k of the inorganic BARC at each within-wafer location where OCD measurement is performed.
Figure 3E:
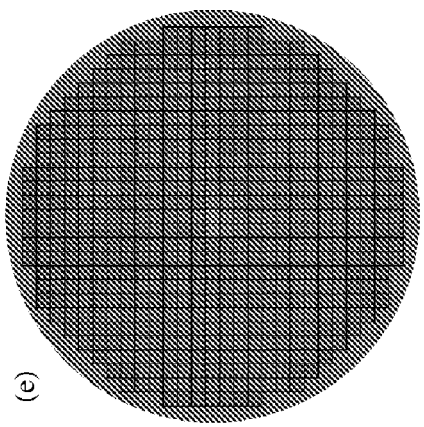
FIG. 3e is a within-wafer SWA map measured by OCD tool with the OCD regression modeling done by using the measured n/k of the inorganic BARC at each within-wafer location where OCD measurement is performed.
Figure 3F:
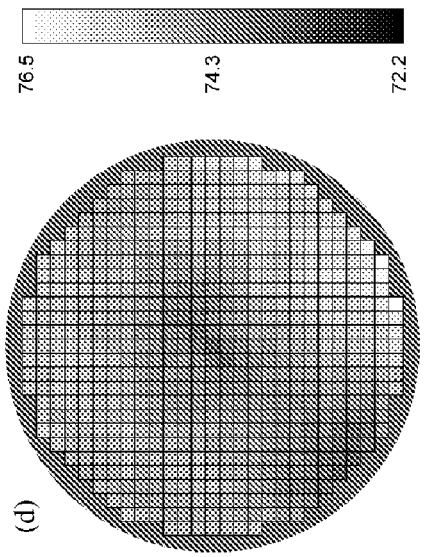
FIG. 3f is the GOF map corresponding to FIG. 3d and FIG. 3e.

To prove the above reasoning, prior to the lithography process, n/k measurements of an inorganic BARC on a wafer substrate are made. After the lithography process, which includes exposure of a specific mask feature at a plurality of within-wafer locations, resultant within-wafer CD and SWA maps measured by OCD using fixed n/k of the inorganic BARC are shown in FIGS. 3a and 3b. The corresponding GOF map is shown in FIG. 3c. The GOF's near the wafer center are lower than those at other areas of the wafer. Thus, the obtained CD data near the wafer center may not be as accurate as those at other areas of the wafer. However, if the regression modeling of OCD is performed for each individual location separately by employing the n/k measured at each corresponding location, resultant within-wafer CD and SWA maps are shown in FIGS. 3d and 3e. The corresponding GOF map is shown in FIG. 3f. It can be seen that the lower GOF's near the wafer center have been restored.

However, in semiconductor mass production, for each sampled wafer, it is hardly possible to measure the n/k of a thin film for each sampled within-wafer location before the lithography process and then to feed forward the measured n/k to the OCD software when measuring the CD for each same location by OCD after the lithography process. Also, since not only the n/k at a specific wavelength but all n/k's through the entire employed wavelength range are involved in the regression modeling of OCD, if all these n/k's are treated as free parameters during the regression, then it is almost impossible to complete the regression within a reasonable period of time.

Aspects of the present disclosure provide a method and system so that the more accurate n/k values of a thin film in the wafer substrate can be automatically determined after the regression modeling of OCD, resulting in the more accurate CD data obtained, by identifying a single parameter that can describe the within-wafer variation of both n and k of the thin film at all employed wavelengths. In the case of an inorganic BARC of which the n/k is tunable by adjusting the flow rate of a specific gas during its deposition process, the flow rate of the specific gas is also used to describe the within-wafer variation of both n and k of the inorganic BARC at all employed wavelengths.

Figure 4:
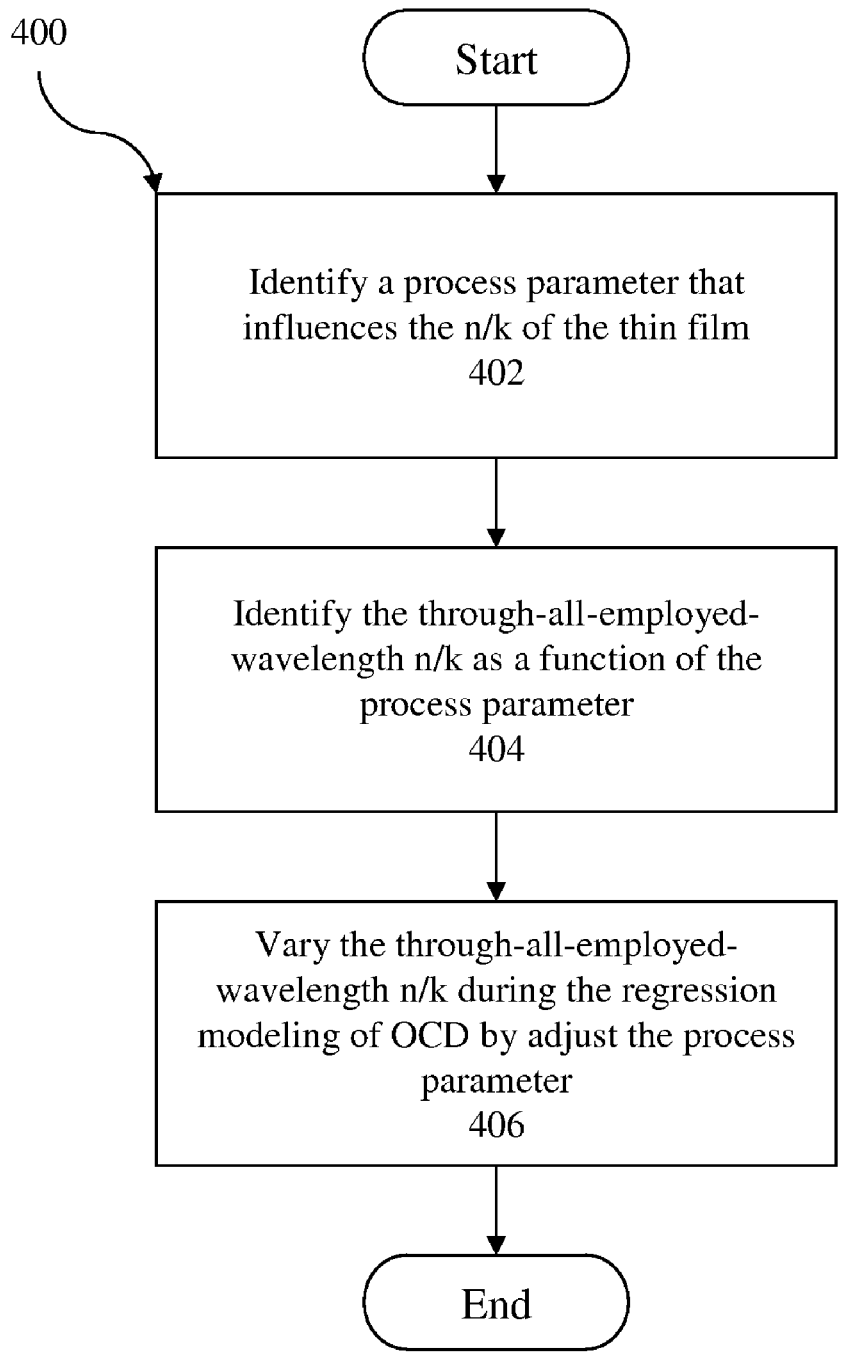
FIG. 4 is a flowchart of an exemplary procedure for improving the accuracy of OCD metrology.

Referring to FIG. 4, a flowchart of an exemplary procedure for improving the accuracy of OCD metrology is depicted. Procedure 400 begins at step 402 to identify a process parameter during the deposition process of the thin film that influences the n/k of the thin film. One exemplary process parameter is the flow rate of a specific gas used to deposit the thin film, since the flow rate may be adjusted to achieve the desired n/k of the thin film during its deposition process.

Once the process parameter is identified, procedure 400 continues to step 404 to identify the through-all-employed-wavelength n/k as a function of the process parameter. For example, the through-all-employed-wavelength n/k is identified as a function of the flow rate of a specific gas. More details regarding step 404 are discussed with reference to FIG. 5 below. Procedure 400 then continues to step 406 to vary the through-all-employed-wavelength n/k of a thin film to achieve a better fit to the experimental spectrum during the regression modeling of OCD by adjusting the process parameter.

Figure 5:
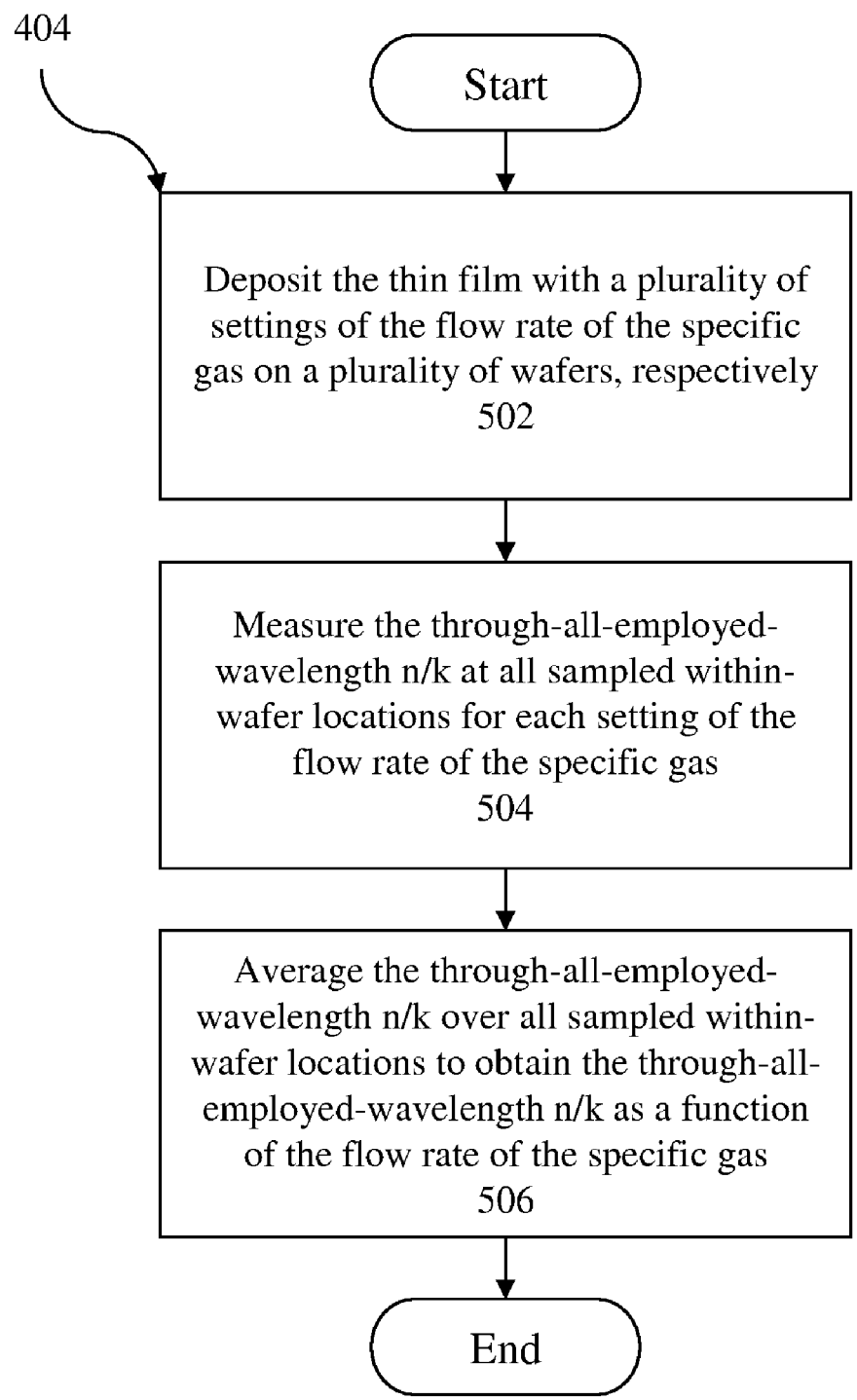
FIG. 5 is a flowchart of an exemplary procedure for identifying the n/k through all employed wavelengths as a function of the process parameter.

Referring to FIG. 5, a flowchart of an exemplary procedure for identifying the through-all-employed-wavelength n/k as a function of the process parameter is depicted. In this illustrative embodiment, the process parameter identified is the flow rate of a specific gas. However, other process parameters may be used to identify the through-all-employed-wavelength n/k without departing from the spirit and scope of the present disclosure.

Procedure 404 begins at step 502 to deposit the thin film with a plurality of settings of the flow rate of a specific gas on a plurality of wafers, respectively. One exemplary specific gas used to deposit the thin film is silane ($SiH_4$) if the thin film is silicon oxynitride (SiON). Procedure 404 then continues to step 504 to measure the through-all-employed-wavelength n/k at all sampled within-wafer locations for each setting of the flow rate of the specific gas. Procedure 404 then continues to step 506 to average the through-all-employed-wavelength n/k over all sampled within-wafer locations to obtain the through-all-employed-wavelength n/k as a function of the flow rate of the specific gas. For example, at each employed wavelength, the n as a function of the flow rate of the specific gas is expressed in terms of a second-order polynomial illustrated in equation (2):

$$n = a2 + a1*x + a0*x^2, \quad (2)$$

where x represents the flow rate of the specific gas, and where a2, a1, and a0 are constants depending on the recipe and tool employed in the deposition process of the inorganic BARC.

Similarly, at each employed wavelength, the k as a function of the flow rate of the specific gas is expressed in terms of a second-order polynomial illustrated in equation (3):

$$k = b2 + b1*x + b0*x^2, \quad (3)$$

where x represents the flow rate of the specific gas, and where b2, b1, and b0 are constants depending on the recipe and tool employed in the deposition process of the inorganic BARC. Using equation (2) and equation (3) at each employed wavelength, the through-all-employed-wavelength n/k of the thin film can be obtained once the flow rate of the specific gas is given.

Figure 6:
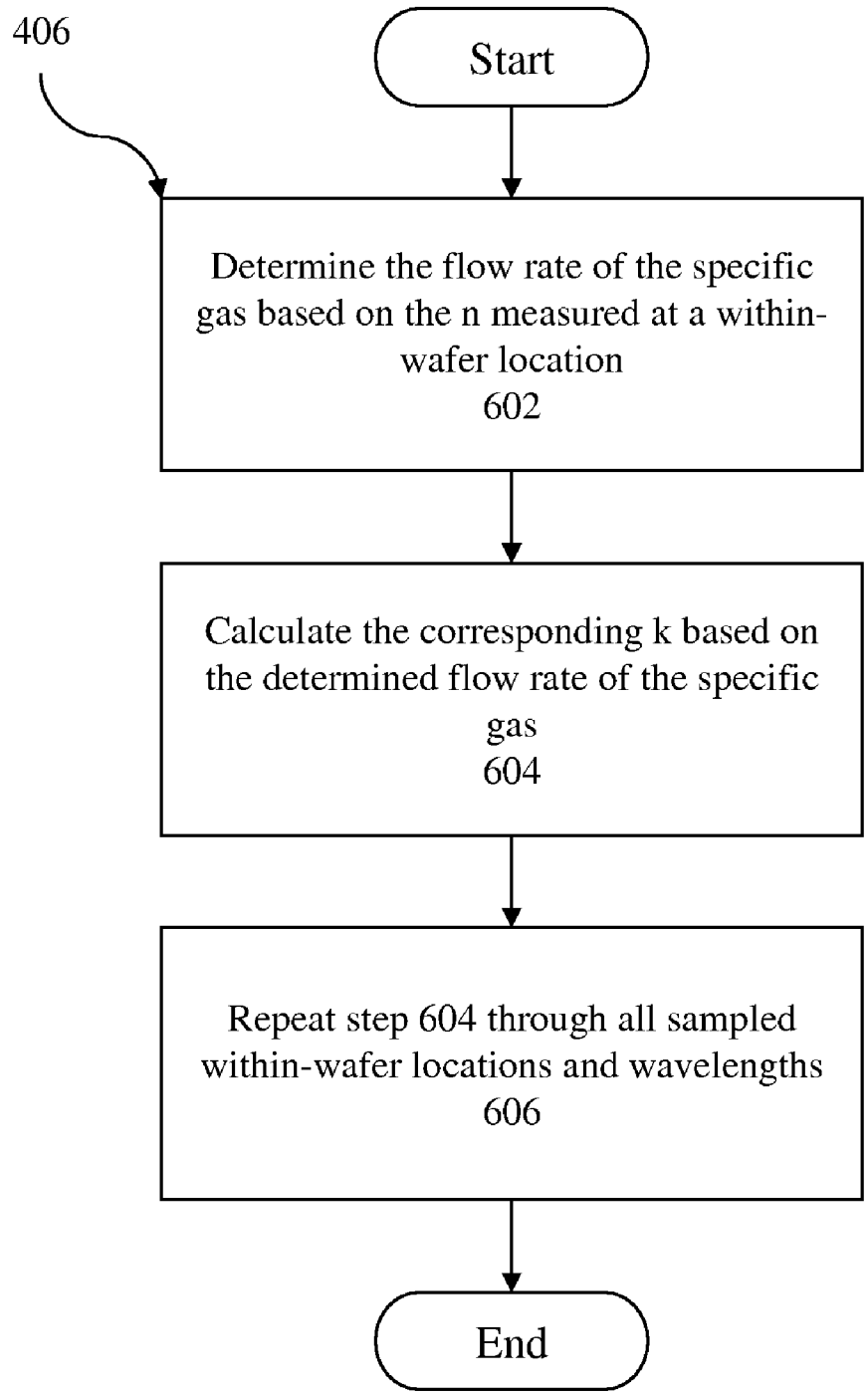
FIG. 6 is a flowchart of an exemplary procedure for verifying that a single parameter can describe the within-wafer variation of both n and k through all employed wavelengths.

Referring to FIG. 6, a flowchart of an exemplary procedure for verifying that a single parameter can be used to describe the within-wafer variation of both n and k of the thin film through all employed wavelengths is depicted. At a given wavelength, based on the n measured at a within-wafer location, procedure 406 begins at step 602 to determine the flow rate of the specific gas via equation (2). Based on the determined flow rate of the specific gas, procedure 406 continues to step 604 to calculate the corresponding k via equation (3). It is found that the calculated k is very close to the measured k at the same within-wafer location where n is measured. Procedure 406 then continues to step 606 to repeat step 604 through all sampled within-wafer locations and wavelengths. Thereafter, the fact that the within-wafer variation of both n and k of the thin film through all employed wavelengths can be parameterized solely by the flow rate of the specific gas is thus verified.

Figure 7A:
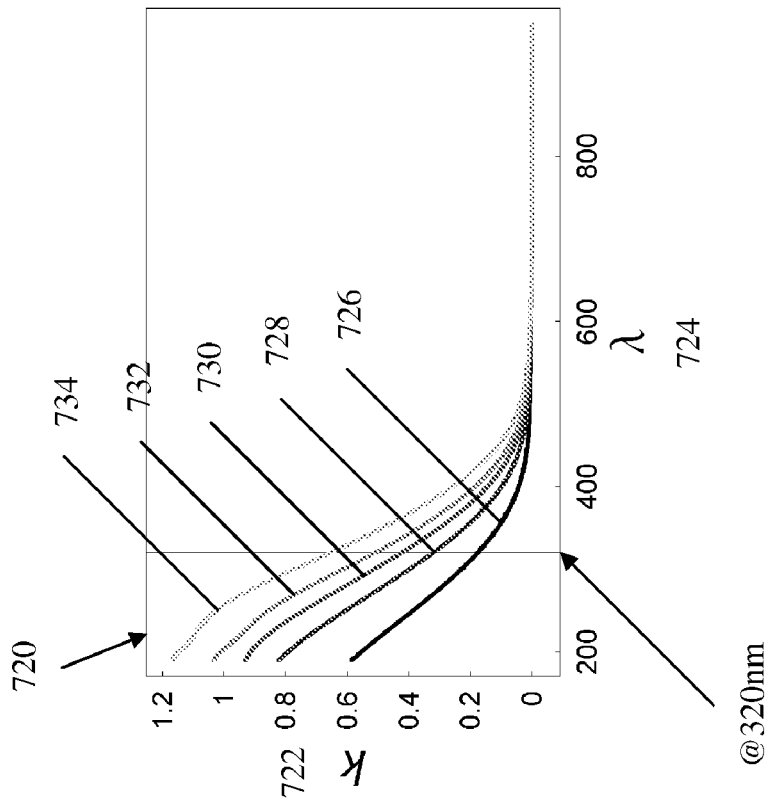
FIG. 7a is a diagram illustrating exemplary measurements of n through all employed wavelengths of an inorganic BARC.

FIG. 7a is a diagram illustrating exemplary measurements of the n of an inorganic BARC through all employed wavelengths. In this example, graph 700 illustrates refractive indices (n) 702 measured through all employed wavelengths ($\lambda$) 704 for different settings of the flow rate of the specific gas, e.g., at flow rate 280 (represented by line 706), 340 (represented by line 708), 380 (represented by line 710), 420 (represented by line 712), 500 (represented by line 714). An example of a specific gas is silane ($SiH_4$) if the inorganic BARC is silicon oxynitride (SiON).

Figure 7B:
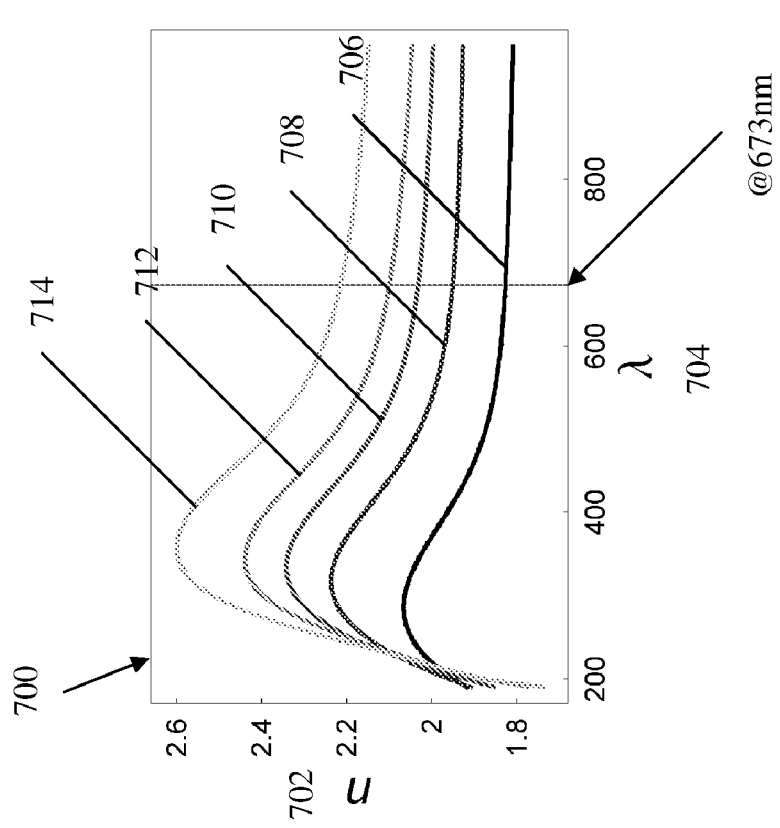
FIG. 7b is a diagram illustrating exemplary measurements of k through all employed wavelengths of an inorganic BARC.

FIG. 7b is a diagram illustrating exemplary measurements of the k of an inorganic BARC through all employed wavelengths. In this example, graph 720 illustrates extinction coefficients (k) 722 measured through all employed wavelengths ($\lambda$) 724 for different settings of the flow rate of the specific gas, e.g., at flow rate 280 (represented by line 726), 340 (represented by line 728), 380 (represented by line 730), 420 (represented by line 732), 500 (represented by line 734).

FIG. 8a illustrates, for an exemplary wavelength, such as 673 nm, how interpolation is made to obtain the n as a function of the flow rate of the specific gas. Then, the n value for any intermediate flow rate of the specific gas can be determined. Graph 800 is derived from graph 700 in FIG. 7a. The dots in graph 800 stand for the n values at gas flow rates 280, 340, 380, 420, and 500, respectively. The line in graph 800 stands for the second-order polynomial represented by equation (2), which is obtained by fitting the above n values. FIG. 8a also illustrates, when verifying that the within-wafer n/k variation can be parameterized solely by the flow rate of the specific gas, how the corresponding gas flow rate is calculated via equation (2) for the measured n at a within-wafer location.

FIG. 8b illustrates, for an exemplary wavelength, such as 320 nm, how interpolation is made to obtain the k as a function of the flow rate of the specific gas. Then, the k value for any intermediate flow rate of the specific gas can be determined. Graph 820 is derived from graph 720 in FIG. 7*b*. The dots in graph 820 stand for the k values at gas flow rates 280, 340, 380, 420, and 500, respectively. The line in graph 820 stands for the second-order polynomial represented by equation (3), which is obtained by fitting the above k values. FIG. 8*b* also illustrates, when verifying that the within-wafer n/k variation can be parameterized solely by the flow rate of the specific gas, how the corresponding k is calculated via equation (3) for the gas flow rate calculated in FIG. 8*a*. It is found that the calculated k is very close to the k measured at the same within-wafer location where n is measured. By repeating the same procedures as those illustrated in FIG. 8*a* and 8*b* for each of the employed wavelengths, the statement that within-wafer n/k variations can be parameterized by the flow rate of the specific gas is thus proved.

In summary, aspects of the present disclosure provide a method and a system for improving the accuracy of OCD metrology by providing a parameter through which the refractive index and extinction coefficient of a thin film in the substrate can be adjusted during the regression modeling of OCD. Thus, OCD metrology errors caused by within-wafer n/k variations are minimized. For example, critical dimension data obtained with and without n/k adjustment may be compared to quantify OCD metrology errors. In one observation, the difference of within-wafer CD uniformity (3σ) between with n/k adjustment and without n/k adjustment is as large as 0.5 nm, which is about 30% of the total within-wafer CD uniformity.

In one embodiment, a method for improving the accuracy of optical critical dimension measurement of a substrate is provided. A process parameter that influences the refractive index and extinction coefficient of a thin film in a wafer substrate is identified. The process parameter can be the flow rate of a specific gas used to fine tune the refractive index and extinction coefficient of the thin film for the purpose of, e.g., minimizing the swing effect. The process parameter is also used to describe the within-wafer variation of the refractive index and extinction coefficient of the thin film deposited with the baseline process condition. The refractive index and extinction coefficient through all employed wavelengths as a function of the process parameter is determined.

To determine the refractive index and extinction coefficient through all employed wavelengths as a function of the process parameter, the thin film is deposited with a plurality of settings of the flow rate of the specific gas on a plurality of wafers, respectively; for each of the plurality of settings, the refractive index and extinction coefficient through all employed wavelengths are measured at all sampled locations within each of the corresponding wafer; at each of the plurality of settings and at each of the employed wavelengths, the measured refractive index and extinction coefficient are averaged over all sampled locations; at each of the employed wavelengths, the averaged measured refractive index and extinction coefficient are interpolated for all intermediate settings with, e.g., a second-order polynomial.

During the regression modeling of optical critical dimension measurement, the floating of the refractive index and extinction coefficient of a thin film in a wafer substrate is realized by adjusting the refractive index and extinction coefficient through all employed wavelengths through the function via the process parameter. The optimal refractive index and extinction coefficient that achieve a better fit to the experimental spectrum are found by minimizing the goodness of fit.

Aspects of the present disclosure are best understood from the following above description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A method for improving accuracy of optical critical dimension measurement of a substrate, the method comprising:
   identifying a process parameter that influences the refractive index (n) and extinction coefficient (k) of a thin film in the substrate;
   identifying the refractive index (n) and extinction coefficient (k) across a plurality of wavelengths as a function of the process parameter;
   adjusting the refractive index (n) and extinction coefficient (k) across the plurality of wavelengths during the regression modeling of the optical critical dimension measurement through the function via the process parameter; and
   completing the optical critical dimension measurement by obtaining an optimal value of the process parameter that minimizes a deviation between an experimental spectrum and its theoretical prediction.

2. The method of claim 1, wherein the process parameter is the flow rate of a specific gas.

3. The method of claim 1, wherein identifying the refractive index (n) and extinction coefficient (k) across a plurality of wavelengths as a function of the process parameter comprises:
   depositing the thin film with a plurality of settings of the flow rate of the specific gas on a plurality of substrates, respectively;
   measuring the refractive index (n) and extinction coefficient (k) across the plurality of wavelengths at a plurality of within-substrate locations for each of the plurality of settings; and
   averaging the refractive index (n) and extinction coefficient (k) across the plurality of wavelengths over the plurality of within-substrate locations to form a function of the refractive index (n) and extinction coefficient (k) across the plurality of wavelengths in terms of a nominal flow rate of the specific gas.

4. The method of claim 2, wherein the specific gas is silane ($SiN_4$).

5. The method of claim 1, wherein the refractive index (n) and extinction coefficient (k) are specific to the thin film.

6. The method of claim 3, wherein the thin film is an inorganic bottom anti-reflection coating (BARC).

7. The method of claim 6, wherein the inorganic BARC includes SiON.

8. The method of claim 6, wherein the refractive index (n) and extinction coefficient (k) of the inorganic BARC is adjustable.

9. The method of claim 3, wherein the function of the refractive index (n) across the plurality of wavelengths expressed in terms of a flow rate of the specific gas comprises $n=a2+a1*x+a0*x^2$, wherein x is the flow rate of the specific gas, and wherein a2, a1, and a0 are constants depending on a recipe and a tool employed in the deposition process of the thin film.

10. The method of claim 3, wherein the function of the extinction coefficient (k) across the plurality of wavelengths expressed in terms of a flow rate of the specific gas comprises $k=b2+b1*x+b0*x^2$, wherein x is the flow rate of the specific gas, and wherein b2, b1, and b0 are constants depending on a recipe and a tool employed in the deposition process of the thin film.

11. The method of claim 1, wherein adjusting the refractive index (n) and extinction coefficient (k) across the plurality of wavelengths during the regression modeling of the optical critical dimension measurement through the function via the process parameter further comprises:
   adjusting the refractive index (n) and extinction coefficient (k) during the regression modeling of the optical critical dimension measurement via the flow rate of the specific gas.

12. The method of claim 1, wherein the deviation between an experimental spectrum and its theoretical prediction is expressed as a goodness of fit.

13. The method of claim 12, wherein the goodness of fit quantifies quality of the optical critical dimension measurements.

14. A system for improving accuracy of optical critical dimension measurement of a substrate comprising:
   identifying means for identifying a process parameter that influences the refractive index (n) and extinction coefficient (k) of a thin film in the substrate;
   identifying means for identifying the refractive index (n) and extinction coefficient (k) across a plurality of wavelengths as a function of the process parameter; and
   adjusting means for adjusting the refractive index (n) and extinction coefficient (k) across the plurality of wavelengths during the regression modeling of the optical critical dimension measurement through the function via the process parameter; and
   completing means for completing the optical critical dimension measurement by obtaining an optimal value of the process parameter that minimizes a deviation between an experimental spectrum and its theoretical prediction.

15. The system of claim 14, wherein the second identifying means comprises:
   depositing means for depositing a thin film with a plurality of settings of the process parameter on a plurality of substrates, respectively;
   measuring means for measuring the refractive index (n) and extinction coefficient (k) across the plurality of wavelengths at a plurality of within-substrate locations for each of the plurality of settings of the process parameter; and
   averaging means for averaging the refractive index (n) and extinction coefficient (k) across the plurality of wavelengths over the plurality of within-substrate locations to form a function of the refractive index (n) and extinction coefficient (k) across the plurality of wavelengths expressed in terms of the process parameter.

16. The system of claim 14, wherein adjusting means for adjusting the refractive index (n) and extinction coefficient (k) across the plurality of wavelengths during the regression modeling of the optical critical dimension measurement through the function via the process parameter comprises:
   adjusting means for adjusting the refractive index (n) and extinction coefficient (k) across the plurality of wavelengths during the regression modeling of the optical critical dimension measurement through the function via a flow rate of a specific gas.

17. The system of claim 16, wherein the specific gas is silane ($SiN_4$).

18. The system of claim 15, wherein the thin film is an inorganic bottom anti-reflection coating (BARC), and wherein the inorganic BARC includes SiON.

19. The system of claim 15, wherein the refractive index (n) and extinction coefficient (k) are specific to the thin film.

20. The system of claim 18, wherein the refractive index (n) and extinction coefficient (k) of the inorganic BARC is adjustable.

* * * * *